(12) United States Patent
Shin et al.

(10) Patent No.: US 9,887,020 B2
(45) Date of Patent: Feb. 6, 2018

(54) DOPED GRAPHENE, METHOD OF MANUFACTURING THE DOPED GRAPHENE, AND A DEVICE INCLUDING THE DOPED GRAPHENE

(75) Inventors: Hyeon-jin Shin, Suwon-si (KR); Won-mook Choi, Hwaseong-si (KR); Jae-young Choi, Suwon-si (KR); Seon-mi Yoon, Yongin-si (KR)

(73) Assignee: SAMSUNG ELECTRONICS CO., LTD., Gyeonggi Do (KR)

( * ) Notice: Subject to any disclaimer, the term of this patent is extended or adjusted under 35 U.S.C. 154(b) by 322 days.

(21) Appl. No.: 12/847,389

(22) Filed: Jul. 30, 2010

(65) Prior Publication Data

US 2011/0127471 A1  Jun. 2, 2011

(30) Foreign Application Priority Data

Dec. 2, 2009 (KR) .................. 10-2009-0118450

(51) Int. Cl.
| | | |
|---|---|---|
| *C01B 32/194* | (2017.01) | |
| *H01B 1/04* | (2006.01) | |
| *B82Y 30/00* | (2011.01) | |
| *B82Y 40/00* | (2011.01) | |
| *H01L 29/16* | (2006.01) | |
| *H01L 29/167* | (2006.01) | |
| *C01B 32/184* | (2017.01) | |
| *H01L 51/00* | (2006.01) | |

(52) U.S. Cl.
CPC ............... *H01B 1/04* (2013.01); *B82Y 30/00* (2013.01); *B82Y 40/00* (2013.01); *C01B 32/184* (2017.08); *C01B 32/194* (2017.08); *H01L 29/1606* (2013.01); *H01L 29/167* (2013.01); *H01L 51/002* (2013.01)

(58) Field of Classification Search
USPC .............. 257/9, E21.042, E29.168, E31.033; 423/447.2, 460; 438/542; 977/742, 749, 977/954
See application file for complete search history.

(56) References Cited

U.S. PATENT DOCUMENTS

| | | | |
|---|---|---|---|
| 7,776,444 B2 | 8/2010 | Rinzler et al. | |
| 2003/0186059 A1 | 10/2003 | Hirata et al. | |
| 2004/0040834 A1* | 3/2004 | Smalley ............... | B82Y 15/00 204/164 |
| 2005/0070657 A1 | 3/2005 | Elkovitch et al. | |
| 2006/0118901 A1 | 6/2006 | Williams et al. | |
| 2006/0188723 A1 | 8/2006 | Rowley et al. | |

(Continued)

FOREIGN PATENT DOCUMENTS

| | | |
|---|---|---|
| JP | 2008056950 A | 3/2008 |
| KR | 1020040055622 A | 6/2004 |

(Continued)

OTHER PUBLICATIONS

Boero et al. A Mechanism of Adsorption of Beta-Nicotinamide Adenine Dinucleotide on GRaphene Sheets: Experiment and Theory; Chem. Eur. J.; 15, 10851-10856; 2009.*

(Continued)

*Primary Examiner* — Guinever S Gregorio
(74) *Attorney, Agent, or Firm* — Cantor Colburn LLP

(57) ABSTRACT

A composition including graphene; and at least one dopant selected from the group consisting of an organic dopant and an inorganic dopant.

11 Claims, 1 Drawing Sheet

(56) References Cited

U.S. PATENT DOCUMENTS

| | | | |
|---|---|---|---|
| 2007/0092432 A1 | 4/2007 | Prud'Homme et al. | |
| 2007/0098620 A1 | 5/2007 | Khabashesku et al. | |
| 2007/0120095 A1* | 5/2007 | Gruner | 252/500 |
| 2007/0131915 A1 | 6/2007 | Stankovich et al. | |
| 2008/0088219 A1* | 4/2008 | Yoon et al. | 313/326 |
| 2008/0191606 A1* | 8/2008 | Geohegan et al. | 313/501 |
| 2008/0299374 A1* | 12/2008 | Choi et al. | 428/220 |
| 2008/0308407 A1* | 12/2008 | Rostovtsev et al. | 204/157.47 |
| 2008/0311424 A1* | 12/2008 | Choi et al. | 428/688 |
| 2008/0317982 A1* | 12/2008 | Hecht et al. | 428/34.1 |
| 2009/0008712 A1* | 1/2009 | Choi et al. | 257/347 |
| 2009/0022650 A1* | 1/2009 | Choi et al. | 423/445 B |
| 2009/0041652 A1* | 2/2009 | Shin et al. | 423/447.1 |
| 2009/0117467 A1 | 5/2009 | Zhamu et al. | |
| 2009/0146111 A1* | 6/2009 | Shin et al. | 252/510 |
| 2010/0022438 A1* | 1/2010 | Roy et al. | 514/2 |
| 2010/0105834 A1* | 4/2010 | Tour et al. | 525/50 |
| 2010/0133480 A1* | 6/2010 | Shin et al. | 252/510 |
| 2010/0140561 A1* | 6/2010 | Choi et al. | 252/510 |
| 2012/0080086 A1 | 4/2012 | Yoon et al. | |

FOREIGN PATENT DOCUMENTS

| | | |
|---|---|---|
| KR | 1020090059871 A | 6/2009 |
| KR | 1020090108459 A | 10/2009 |
| KR | 1020100031475 A | 3/2010 |

OTHER PUBLICATIONS

Alonso et al.; The Interaction of Sulfuric Acid with Graphene and Formation of Adsorbed Crystals; Nanothechnology; 18, 485705; 2007.*

Wang et al.; Transparent, Conductive Graphene Electrodes for Dye-Sensitized Solar Cells; Nano Letters; vol. 8, No. 1, pp. 323-327; 2008.*

Parekh et al. Improved Conductivity of Transparent Single-Wall Carbon Nanotube Thin Films Via Stable Postdeposition Functionalization; Applied Physics Letters; 90, 12913; 2007.*

Kasry et al. Chemical Doping of Large-Area Stacked Graphene Films for Use as Transparent, Conducting Electrodes; ACS Nano; vol. 4, No. 7, pp. 3839-3844; Jul. 12, 2010.*

Tour et al.; Longitudinal Unzipping of Carbon Nanotubes to Form Grapene Nanoribbons; Nature; vol. 458; Apr. 16, 2009.*

Pasquali et al.; Spontaneous High-Concentration Dispersions and Liquid Crystals of Graphene; Nature Technology; vol. 5; Published online May 2010.*

Brodie, M.B.-C., "Sur le poids atomique graphite," Ann Chim Phys 1860, 59, 466-472. Supplied by the British Library—"The world's knowledge".

Eda, Goki, et al., "Transparent and conducting electrodes for organic electronics from reduced graphene oxide," Applied Physics Letters 92 2008, pp. 233305-1-23305-3.

Farmer, Damon B., et al., "Chemical Doping and Electron-Hole Conduction Asymmetry in Graphene Devices," Published in Nano Letters, 2009, vol. 9, No. 1, pp. 388-392.

Final Office Action from related U.S. Appl. No. 12/171,551, dated Dec. 10, 2010, 9 pages.

Gierz, Isabella, et al., "Atomic Hole Doping of Graphene," Nano Letters, 2008, vol. 8, No. 12, pp. 4603-4607.

Gomez-Navarro, Cristina, et al., "Electronic Transport Properties of Individual Chemically Reduced Graphene Oxide Sheets," Nano Letters, 2007, vol. 7, No. 11, pp. 3499-3503.

Hummers, Jr., William S., et al., "Preparation of Graphite Oxide," Mar. 20, 1958, p. 1339, Contribution from the Baroid Division, National Lead Company.

Khomyakov, P. A., et al., "First-principles study of the interaction and charge transfer between graphene and metals," Physical Review B, 79, 2009, pp. 195425-1-195425-12.

Lu, Y.H., et al., "Tuning the Electronic Structure of Graphene by an Organic Molecule," Letters, J. Phys. Chem. B, vol. 113, No. 1, 2009, pp. 2-5.

Non-Final Office Action from related U.S. Appl. No. 12/171,551, dated Jun. 4, 2010, 11 pages.

Stankovich, Sasha, et al., "Synthesis of graphene-based nanosheets via chemical reduction of exfoliated graphite oxide," Carbon 45, accepted Feb. 19, 2007, pp. 1558-1565, Science Direct.

Staudenmaier, L., "Vertahren zur Darstellung der Graphitsaure," Ber Dtsch Chem Ges 1898, 31, 1481-1499, Supplied by The British Library—"The world's knowledge".

Watcharotone, Supinda, et al., "Graphene-Silica Composite Thin Films as Transparent Conductors," Nano Letters, 2007, vol. 7, No. 7, pp. 1888-1892.

Yu, Young-Jun, et al., "Tuning the Graphene Work Function by Electric Field Effect," Nano Letters, 2009, vol. 9, No. 10, pp. 3430-3434.

Kang et al., "Restorable Type conversion of Carbon Nanotube Transistor Using Pyrolytically Controlled Antioxidizing Photosynthesis Coenzyme", Adv. Funct. Mater., vol. 19, 2009, pp. 2553-2559.

Kim et al., "Reduction-Controlled Viologen in Bisolvent as an Environmentally Stable n-Type Dopant for Carbon Nanotubes", J. Am. Chem. Soc., vol. 131, 2009, pp. 327-331.

Korean Notice of Non-Final Rejection for Korean Patent Application No. 10-2009-0118450 dated Jul. 2, 2015 with English Translation.

* cited by examiner

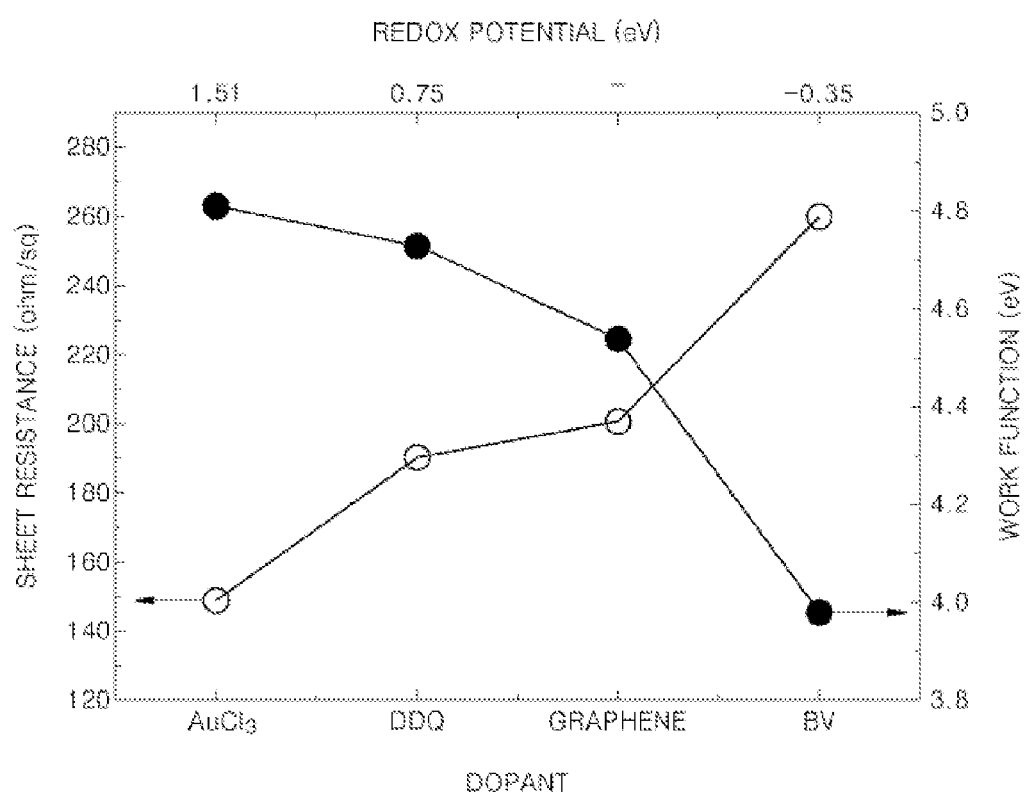

DOPED GRAPHENE, METHOD OF MANUFACTURING THE DOPED GRAPHENE, AND A DEVICE INCLUDING THE DOPED GRAPHENE

CROSS-REFERENCE TO RELATED APPLICATION

This application claims priority to Korean Patent Application No. 10-2009-0118450, filed on Dec. 2, 2009, and all the benefits accruing therefrom under 35 U.S.C. §119, the content of which in its entirety is herein incorporated by reference.

BACKGROUND

1. Field

The present disclosure relates to a doped graphene, a method of manufacturing the doped graphene, and an electrode, a display device, and a solar cell including the doped graphene. The doped graphene may have excellent electrical characteristics.

2. Description of the Related Art

Generally, graphite has a structure in which two-dimensional (2D) graphene sheets, in which carbon atoms are connected to each other in a hexagonal array, are stacked on each other. Recently, several studies showed that single-layered or multiple-layered graphene sheets have amazing properties. One notable property is that electrons flow in a graphene sheet as if they are weightless, which means that electrons flow at the velocity of light in vacuum. In addition, an unusual half-integer quantum hall effect for both electrons and holes has been observed in graphene sheets.

Electron mobility in known graphene sheets is about 20,000 to about 50,000 square centimeters per volt per second ($cm^2$/Vs). Also, it is advantageous to use graphene sheets because products made from graphite may be inexpensive, while products made from carbon nanotubes, which are similar to graphene sheets, may be expensive due to low yields obtained during the synthesis and purification of carbon nanotubes, even though the carbon nanotubes themselves are inexpensive. Single wall carbon nanotubes exhibit different metallic and semiconducting characteristics depending on their chirality and diameter. Thus, in order to obtain a metallic single wall carbon nanotube composition or a semiconducting single wall carbon nanotube composition, it is desirable to separate the single wall carbon nanotubes from each other in order to obtain desired metallic or semiconducting characteristics respectively. Furthermore, single wall carbon nanotubes having identical semiconducting characteristics may have different energy band gaps depending on their chirality and diameter. Thus, single wall carbon nanotubes are desirably separated from each other in order to obtain desired semiconducting or metallic characteristics. However, separating single wall carbon nanotubes is difficult.

On the other hand, because the metallic and semiconducting characteristics of a graphene sheet depend on crystallographic orientation, a device may be designed to exhibit desired electrical characteristics by arranging the crystallographic orientation of the graphene sheet in a desired direction. In addition, there is a need to control a work function of graphene in order to apply graphene having metallic features to electrodes of devices such as display devices or solar cells.

SUMMARY

Provided is a p-doped or n-doped graphene having a controlled work function.

Provided is an electrode including graphene having a controlled work function due to doping.

Provided is a display device including the electrode.

Additional aspects will be set forth in part in the description which follows and, in part, will be apparent from the description.

According to an aspect, a composition includes graphene; and a dopant selected from the group consisting of an organic dopant, an inorganic dopant, and a combination including at least one of the foregoing.

The organic dopant may include at least one selected from the group consisting of an ionic liquid, an acidic compound, and an organic compound.

The organic dopant may include at least one p-dopant selected from the group consisting $NO_2BF_4$, $NOBF_4$, nitronium hexafluoroantimonate ("NHFA", $NO_2SbF_6$), HCl, $H_2PO_4$, $CH_3COOH$, $H_2SO_4$, $HNO_3$, dichlorodicyanoquinone ("DDQ"), OXONE®, dimyristoylphosphatidylinositol ("DMPI"), and trifluoromethanesulfonimide.

The inorganic dopant may include at least one p-dopant selected from the group consisting of $HPtCl_4$, $AuCl_3$, $HAuCl_4$, silver trifluoromethanesulfonate ("AgOTfs"), $AgNO_3$, $H_2PdCl_6$, palladium(II) acetate ("Pd(OAc)$_2$"), and $Cu(CN)_2$.

The organic dopant may include at least one n-dopant selected from the group consisting of a reduction product of a substituted or unsubstituted nicotinamide; a reduction product of a compound which is chemically bound to a substituted or unsubstituted nicotinamide; and a compound including at least two pyridinium moieties in which a nitrogen atom of at least one of the pyridinium moieties is reduced.

According to another aspect, there is provided an electrode including the composition.

The electrode may be transparent and/or flexible.

According to another aspect, there is provided a display device including the electrode.

The display device may be an organic light emitting display device ("OLED"), an electronic paper-like display, a liquid crystal device ("LCD"), or a plasma display panel ("PDP").

Also disclosed is a solar cell including the electrode.

BRIEF DESCRIPTION OF THE DRAWING

These and/or other aspects will become apparent and more readily appreciated from the following description of the embodiments taken in conjunction with the accompanying drawing in which:

FIG. 1 is a graph illustrating sheet resistance (ohms per square) and work function (electron volts, eV) of exemplary embodiments of p- and n-doped graphene prepared according to Example 1.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the FIGURES, to explain aspects of the present description. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the FIGURES. It will be understood that relative terms are intended to encompass different orientations of the device in addition to the orientation depicted in the FIGURES. For example, if the device in one of the FIGURES is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs.

As used herein, unless otherwise provided, the term "substituted" refers to a compound or radical substituted with at least one (e.g., 1, 2, 3, 4, 5, 6 or more) substituents independently selected from a halogen (e.g., F, Cl, Br, I), a carboxyl group, an amino group, a nitro group, a cyano group, a substituted or unsubstituted C1-C20 alkyl group, a substituted or unsubstituted C1-C20 alkenyl group, a substituted or unsubstituted C1-C20 heteroalkyl group, or a substituted or unsubstituted C1-C20 alkoxy group, or a combination thereof, instead of hydrogen, provided that the substituted atom's normal valence is not exceeded.

According to an embodiment, a work function of graphene is controlled by doping the graphene with an organic and/or an inorganic dopant, and a thin film including the graphene having the controlled work function may be efficiently used for an electrode of a variety of devices, such as a display device or a solar cell.

The term "graphene" as used herein refers to a polycyclic aromatic molecule formed from a plurality of carbon atoms covalently bound to each other. The covalently bound carbon atoms may form a 6-membered ring as a repeating unit, or may further include at least one of a 5-membered ring and a 7-membered ring. Accordingly, in the graphene, the covalently bound carbon atoms (generally having $sp^2$ hybridization) form a single layer. The graphene may have various structures which are determined according to the amount of the 5-membered rings and/or 7-membered rings which may be contained in the graphene. The graphene may have a single layer or a plurality of layers, and the graphene may have a thickness of about 1 nm to about 100 nm, specifically about 10 nm to about 80 nm, more specifically a thickness of up to about 100 nm.

If the graphene is doped with a p-dopant, electrons flow out of the graphene, thereby increasing the work function of the graphene. On the other hand, if the graphene is doped with an n-dopant, electrons flow into the graphene, thereby reducing the work function of the graphene. By doping the graphene as described above, the work function of the graphene may be controlled in various ways.

Hereinafter, additional embodiments will be described.

A nicotinamide compound may be used as a material for the n-doping of the graphene. For example, a substituted or unsubstituted nicotinamide or a reduction product thereof; or a compound that is chemically bound to the substituted or unsubstituted nicotinamide or reduction product thereof may be used.

The substituted or unsubstituted nicotinamide may be represented by Formula 1 below.

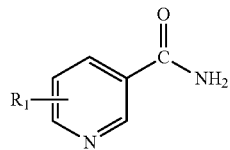

Formula 1

In Formula 1, $R_1$ is a halogen group, a carboxyl group, an amino group, a nitro group, a cyano group, a substituted or unsubstituted C1-C20 alkyl group, a substituted or unsubstituted C1-C20 alkenyl group, a substituted or unsubstituted C1-C20 heteroalkyl group, or a substituted or unsubstituted C1-C20 alkoxy group. The compound according to Formula 1 may be substituted with 1 to 4 $R_1$ groups, specifically 2 to 3 $R_1$ groups.

While not wanting to be bound by theory, it is understood that when the substituted or unsubstituted nicotinamide is heated, nitrogen (N) in the ring loses an electron to form a nitrogen ion ($N^+$) as shown in Reaction Scheme 1 below, and the electron emitted from N participates in the n-doping of the graphene. Thus nicotinamide functions as a reducing agent that provides an electron to the graphene, thereby n-doping the graphene.

Reaction Scheme 1

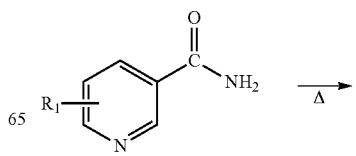

-continued

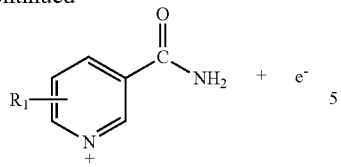

-continued

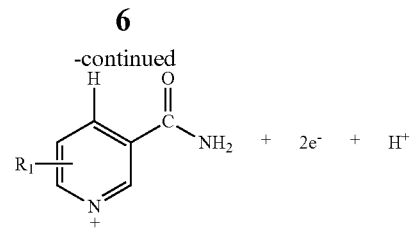

In Reaction Scheme 1, R₁ is as described above.

A reduced form of the substituted or unsubstituted nicotinamide represented by Formula 2 below may also be used. As shown in Reaction Scheme 2 below, when the reduced nicotinamide is heated, nitrogen (N) in the ring loses an electron to form a nitrogen ion (N⁺), and hydrogen (H) in the ring loses an electron to form a hydrogen ion (H⁺). These two electrons participate in the n-doping of the graphene.

Formula 2

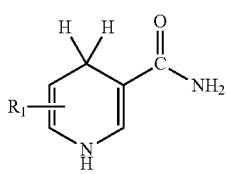

In Formula 2, R₁ is as described above.

Reaction Scheme 2

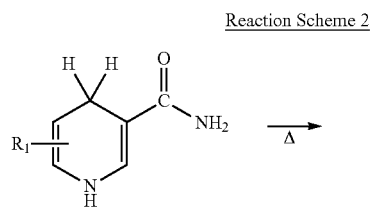

In Reaction Scheme 2, R₁ is as described above.

In addition to the substituted or unsubstituted nicotinamide, in an embodiment a compound may be chemically bound to the substituted or unsubstituted nicotinamide and the resulting complex, or reduction product thereof, may be used.

Examples of the complex including a compound that is chemically bound to the substituted or unsubstituted nicotinamide include nicotinamide mononucleotide ("NMN"), nicotinamide adenine dinucleotide ("NAD"), and nicotinamide adenine dinucleotide phosphate ("NAD(P)"), but are not limited thereto. Any compound that may be chemically bound to nicotinamide may also be used.

For example, NMN is formed by binding nicotinamide to a nucleotide, NAD is formed by binding nicotinamide, a dinucleotide, and adenosine, and NADP has a structure in which the hydroxyl (—OH) at the 2'C site of adenosine of NAD is substituted with phosphoric acid. Nicotinamide mononucleotide-H ("NMNH") is a reduction product of NMN, and nicotinamide adenine dinucleotide phosphate-H ("NAD(P)H") is a reduction product of NAD(P). The structure of NAD(P)H is shown in Formula 3 below.

Formula 3

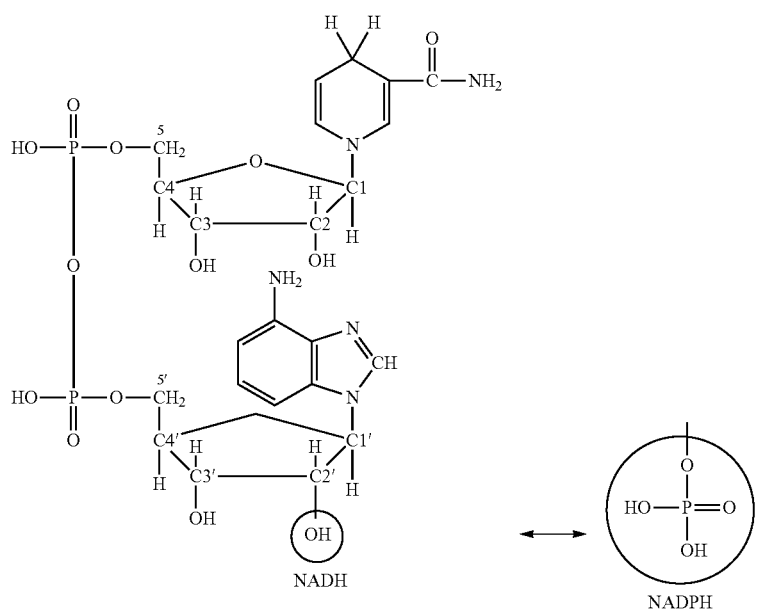

NAD(P)H of Formula 3 releases an electron by heat-treatment to form a reduction product as shown in Reaction Scheme 3 below.

Reaction Scheme 3

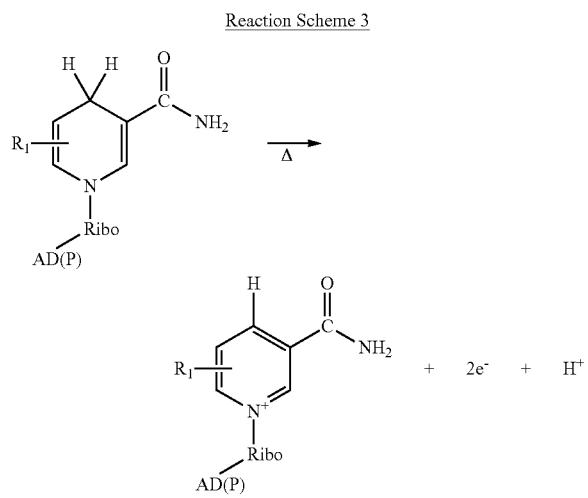

In Reaction Scheme 3, "Ribo" is ribose, and AD(P) is adenosine dinucleotide (phosphate).

As shown in Reaction Scheme 3, the N of the nicotinamide ring of NAD(P)H is converted into $N^+$, and the H bound to the carbon that is opposite to the N is converted into $H^+$ and released. Accordingly, 2 electrons are released therefrom and may participate in the n-doping of the graphene. NAD(P) releases one electron and N of the nicotinamide ring is converted into $N^+$.

This mechanism is similar to that of the reduction of nicotinamide according to Reaction Schemes 1 and 2. Thus, while not wanting to be bound by theory, it is understood that the nicotinamide moiety of NAD(P) or NAD(P)H may enable NAD(P) or NAD(P)H to function as a n-doping material. Also, doping cannot be performed using a portion of NAD(P)H other than nicotinamide, such as adenine. This may also be observed in NMN or NMNH.

The nicotinamide moiety of the nicotinamide compound is understood to contribute to the n-doping of the graphene because nicotinamide participates in the redox reaction. Thus, the oxidized form $NAD(P)^+$ cannot function as a reducing agent because it cannot provide an electron, thus is not used as a material for the n-doping.

If graphene is n-doped using the nicotinamide compound, the graphene may not be dedoped in air (e.g., it is stable in air) and the doped state may be stably maintained for a long period of time. In addition, the nicotinamide compound does not comprise a metal such as alkali metal, and thus, it may not be oxidized. Thus, the nicotinamide compound may be efficiently used as the n-doping material.

In an embodiment, the compound that is chemically bound to the nicotinamide is more stable in a doped form than doped nicotinamide. For example, NAD(P) or NAD(P)H includes nicotinamide and adenine. Because a portion of NAD(P) or NAD(P)H other than nicotinamide, such as adenine, protects the nicotinamide, dedoping may be inhibited when exposed to air and the stability of the doped form may be improved.

The amount (e.g., concentration) of the nicotinamide compound may influence the n-doping state of the graphene. As the amount (e.g., concentration) of the nicotinamide compound increases, a proportion of the graphene that is n-doped may increase. Accordingly, the doping state of the graphene may be easily controlled by adjusting the amount of the nicotinamide compound.

According to another embodiment, another reduced pyridinium compound may be used as a material for the n-doping of the graphene. The pyridinium compound may include at least two pyridinium moieties in its molecular structure when in a reduced state. The reduced compound may include reduced nitrogen in the ring of at least one pyridinium compound.

The pyridinium compound may be a viologen. A reduced viologen is nonpolar and solvent-philic, an oxidized viologen is hydrophilic. Because the reduced viologen is less stable than unreduced viologen, the viologen may return to the more stable state by releasing an electron. If the viologen is artificially reduced, the reduced viologen reacts with an adjacent graphene to voluntarily supply an electron to the graphene and return to its initial and more stable state.

A compound including at least two pyridinium moieties has a low redox potential and may be artificially reduced so that an oxidation state thereof is changed into a relatively unstable state. Reduced compounds in an unstable state voluntarily supply electrons into the graphene to return to a more stable state. If the compound includes a resonant bridge (e.g., conjugated) structure between the at least two pyridinium moieties of the compound, the reduced compound may be in a more unstable state, thereby more voluntarily supplying an electron to the graphene.

The compound including at least two pyridinium compounds may be a viologen and may include a bipyridinium compound, but is not limited thereto.

The viologen may be a 4,4'-bipyridyl compound that is a diquaternary compound. The polarity of viologen may vary upon oxidation and reduction.

The viologen may be 1,1'-dibenzyl-4,4'-bipyridinium dichloride ("BV"), and may be contacted with $NaBH_4$ as a reducing agent to reduce nitrogen in the ring of each pyridinium of $BV^{2+}$. Thus the sequential reduction of $BV^{2+}$ to $BV^+$ (partially reduced) and reduction of $BV^+$ to $BV^0$ (completely reduced) may occur, and the viologen (e.g., BV) in the partially or completely reduced state may provide an electron to the graphene and return to its more stable state.

As described above, partially or completely reduced viologen provides an electron to the graphene and thus the viologen may be used as a material for the n-doping of the graphene. When the viologen is completely reduced, more electrons may be provided to the graphene than when partially reduced viologen is used. Thus, the n-doping degree may be increased by complete reduction of the viologen.

The viologen may be 1,1'-dibenzyl-4,4'-bipyridinium dichloride ("BV"), methyl viologen dichloride hydrate ("MV"), ethyl viologen diperchlorate ("EV"), 1,1'-dioctadecyl-4,4'-bipyridinium dibromide ("DBDB"), or the like, or a combination comprising at least one of the foregoing, but is not limited thereto.

In addition, the viologen may include a molecular structure that includes a conjugated moiety between the two pyridines. That is, if the structure has a bridged conjugated structure between pyridines positioned at ends of the molecule, the pyridines may be zero valent by resonance. Such a conjugated structure may more readily supply an electron to the graphene in a reduced state.

A viologen having a molecular structure which includes conjugation between the pyridiniums is referred to as extended viologen.

In the extended viologen, the conjugated molecular structure may include an aryl, alkenyl, or alkynyl, moiety, or the like, or a combination comprising at least one of the foregoing. For example, the molecular structure may include a phenyl, ethenyl, or thiophenyl group, or a combination comprising at least one of the foregoing. The molecular structure may also be a di-octyl bis(4-pyridyl)biphenyl viologen, and may be a bipolaron.

However, the viologen is not limited thereto.

A reducing agent may be used to reduce the pyridinium compound. The reducing agent may include at least one selected from the group consisting of $NaBH_4$, $LiAlH_4$, NaH, $CaH_2$, and hydrazine, and a combination comprising at least one of the foregoing, but is not limited thereto. In an embodiment, any reducing agent that may reduce the pyridinium compound may also be used. In this regard, in order to control the degree of reduction, the amount of the reducing agent may be selected.

The reduced compound may be provided to (e.g., contacted with) the graphene to be n-doped so that an electron is supplied to the graphene to perform the n-doping.

A solution may be used as a medium to provide the reduced compound to the graphene. In an embodiment, a solution including the reduced compound is prepared and contacted with the graphene to be n-doped. The graphene to which the solution including the reduced compound is applied may be heated to remove the solvent.

When the graphene is n-doped with a reduced compound, such as a compound including at least two pyridinium moieties, such as a viologen for example, the graphene may not be dedoped in the air and the doping may be stably maintained for a long period of time. Thus, the compound may be efficiently used as the n-doping material.

The amount of the reduced compound may influence the n-doping state of the graphene. In an embodiment, as the amount of the reduced compound increases, the progress of the n-doping is increased. Accordingly, the doping state of the graphene may be easily controlled by selecting the amount of the reduced compound.

One or more embodiments provide graphene having excellent electrical characteristics due to use of an organic dopant, an inorganic dopant, or a combination comprising at least one of the foregoing, and an electrode, a display device, and a solar cell including the graphene.

Because the graphene doped with the dopant disclosed above has high transmittance and conductivity, it may be applied to various devices, such as a transparent electrode. The graphene may be prepared by various methods, such as a vapor phase method and a liquid phase method, and have excellent electrical characteristics by doping it with the organic and/or inorganic dopant. The transparent electrode may be efficiently used in a display device, such as a liquid crystal device ("LCD"), an electronic paper-like display, an organic light emitting display device ("OLED"), a battery, or a solar cell.

The transparent electrode may be flexible and include a flexible substrate. If the flexible transparent electrode is used, a display device including the flexible transparent electrode may be bent and conveniently used. In addition, a solar cell may have a structure oriented in a direction towards incident light to improve light absorption efficiency by employing the flexible transparent electrode.

An organic light emitting display device is an active type light emitting display device in which when an electric current is applied to a fluorescent or phosphorescent organic compound thin layer, an electron is combined with a hole in the organic layer, thereby emitting light. An organic light emitting display device includes an anode, a hole transport layer, an emission layer, an electron transport layer, and a cathode, which are sequentially formed on a substrate. In order to easily inject an electron and a hole, the organic light emitting display device may further include an electron injection layer and a hole injection layer. If desired, a hole blocking layer and a buffer layer may further be included. Because the anode comprises a transparent material having high conductivity, the graphene doped with a p-dopant may efficiently be used as the transparent electrode.

Hereinafter, one or more embodiments will be described in further detail with reference to the following examples. However, these examples are not intended to limit the scope of disclosed embodiments.

Preparation Example 1: Preparation of Graphene

Ni was deposited on a 1.2 centimeter (cm) by 1.5 cm silicon substrate on which 100 nm of $SiO_2$ was coated using sputtering to form a Ni thin film. The silicon substrate on which the $SiO_2$ and the Ni thin film are formed was disposed in a chamber. Then, the silicon substrate was heat-treated at 400° C. for 20 minutes using a halogen lamp to form graphene on the graphitizing catalyst while uniformly adding acetylene gas to the chamber at 200 standard cubic centimeters per minute (sccm).

Then, the heat source was removed, and the chamber was naturally cooled to grow the graphene in a uniform alignment to form a 1.2 cm by 1.5 cm graphene sheet with 10 layers.

Then, a chlorobenzene solution (5 weight percent, wt %) in which poly(methyl methacrylate) ("PMMA") was dissolved was coated on the substrate on which the graphene sheet is formed at 1000 revolutions per minute ("rpm") for 60 seconds. The resultant was immersed in 0.1 M $HNO_3$ for 1 hour to remove the Ni thin film to isolate the graphene sheet attached to PMMA. The graphene sheet attached to PMMA was placed on a plastic substrate and dried, and then PMMA was removed using acetone.

Example 1: Doping of Graphene

Graphene sheet films having a transparency up to 72% at 550 nanometers (nm) and prepared according to Preparation Example 1 were respectively immersed in a $AuCl_3$ solution (10 millimolar, mM) as a p-dopant, a dichlorodicyanoquinone ("DDQ") solution (10 mM) as a p-dopant, and a 1,1'-dibenzyl-4,4'-bipyridinium dichloride ("BV") solution (10 mM) as a n-dopant, for 1 hour, and then washed with water and dried by spin coating.

Experimental Example: Identification of Doping Effect of Graphene

After doping the graphene, the physical characteristics of graphene were measured. The results are shown in Table 1 below.

TABLE 1

| | Dopant | | | | |
|---|---|---|---|---|---|
| Unit | Redox potential volts vs SHE | Sheet resistance ohm/sq | Hall coef. $m^2$/C | Concentration of dopant in graphene #/$cm^2$ | Work function |
| $AuCl_3$ | 1.51 | 149 | 25.9 | 2.43E+13 | 4.81 |
| DDQ | 0.75 | 190 | 30.6 | 2.04E+13 | 4.73 |

TABLE 1-continued

| Unit | Dopant | | | | |
|---|---|---|---|---|---|
| | Redox potential volts vs SHE | Sheet resistance ohm/sq | Hall coef. $m^2/C$ | Concentration of dopant in graphene $\#/cm^2$ | Work function |
| None (pure graphene) | — | 201 | 35.3 | 1.77E+13 | 4.54 |
| BV | −0.35 | 260 | −29.7 | −2.10E+13 | 3.98 |

(SHE refers to standard hydrogen electrode, eV refers to electron volts, ohm/sq refers to ohms per square)

The redox potential refers to the standard redox potential of each material for comparison with that of the graphene. The sheet resistance was measured using a 4-probe sheet resistivity measurement unit.

Referring to Table 1, the work function increased as the redox potential increased from negative (−) to positive (+). As shown in Table 1, the work function increased from 3.98 to 4.81. This indicates that the doped graphene may replace a metal electrode such as Ti (work function: 4.1), Al (work function: 4.4), Cr (work function: 4.6), or Au (work function: 5.0) in a device by controlling the amount of the dopant.

In Table 1, the Hall coefficient indicates an area corresponding to the flow of one coulomb (1 C) of electrons in a Hall measurement. A positive (+) value indicates the migration of holes, and a negative (−) value indicates the migration of electrons. As the absolute value of the coefficient increases, the migration of charges is less blocked.

FIG. 1 is a graph illustrating a sheet resistance and work function of p- and n-doped graphene prepared according to Example 1.

Example 2: Preparation of Organic Light Emitting Display Device

The p-doped graphene was used instead of indium tin oxide ("ITO") to form an anode pattern, and the anode was washed. Poly(3,4-ethylenedioxythiophene) ("PEDOT") was coated on the washed transparent electrode to a thickness of about 50 nm, and then baked at 120° C. for about 5 minutes to form a hole injection layer.

A polymer (ADS232GE, American Dye Source, Inc.) was spin coated on the hole injection layer, and baked at 100° C. for 1 hour. A solvent was completely removed in a vacuum oven to form an emission layer with a thickness of 80 nm.

Then, tris(8-hydroxyquinolinato)aluminum ("Alq$_3$") was vacuum deposited on the polymer emitting layer using a vacuum depositor at 1.0 angstrom per second (Å/sec) while maintaining the vacuum level at $4 \times 10^{-6}$ torr or less to form an electron transport layer with a thickness of 30 nm. LiF was vacuum deposited at 0.1 Å/sec to form an electron injection layer with a thickness of 5 nm.

Then, the n-doped graphene was used instead of Al to form a cathode, and the resultant was encapsulated to prepare an organic light emitting display device. The encapsulation was performed by adding BaO powder in a glove box under a dry nitrogen gas atmosphere, sealing in the glove box using a metal can, and treating the resultant with a UV hardening agent.

As described above, according to the one or more of the above embodiments, the work function of the graphene may be controlled by the p-doping or n-doping. Thus, the graphene that is p-doped or n-doped may be used to form not only a transparent electrode having excellent transparency and conductivity, but also an electrode replacing various metallic electrodes, which may be applied to a variety of devices, including a display device or a solar cell.

It should be understood that the exemplary embodiments described therein should be considered in a descriptive sense only and not for purposes of limitation. Descriptions of features or aspects within each embodiment should be considered as available for other similar features or aspects in other embodiments.

What is claimed is:

1. A composition comprising:
    a graphene sheet having a planar structure, wherein the graphene sheet consists of a plurality of carbon atoms covalently bound to each other; and
    at least one n-dopant selected from the group consisting of a reduction product of a substituted or unsubstituted nicotinamide; a reduction product of a compound which is chemically bound to a substituted or unsubstituted nicotinamide; and a compound comprising at least two pyridinium moieties in which a nitrogen atom of at least one of the pyridinium moieties is reduced,
    wherein the reduction product of the compound which is chemically bound to the substituted or unsubstituted nicotinamide is nicotinamide mononucleotide-H or nicotinamide adenine dinucleotide phosphate-H,
    wherein the compound comprising at least two pyridinium moieties in which a nitrogen atom of at least one of the pyridinium moieties is reduced is a viologen,
    wherein the composition has a work function which is different than a work function of the graphene sheet.

2. The composition of claim 1, wherein the viologen is at least one selected from the group consisting of 1,1'-dibenzyl-4,4'-bipyridinium dichloride, methyl viologen dichloride hydrate, ethyl viologen diperchlorate, 1,1'-dioctadecyl-4,4'-bipyridinium dibromide, and di-octyl bis(4-pyridyl)biphenyl viologen.

3. The composition of claim 1, wherein the viologen has a molecular structure which includes a conjugated bipyridyl structure.

4. The composition of claim 3, wherein the molecular structure includes at least one group selected from the group consisting of an aryl group, an alkenyl group, and an alkynyl group.

5. The composition of claim 1, wherein the composition comprises a p-dopant selected from the group consisting of AuCl$_3$ and dichlorodicyanoquinone.

6. The composition of claim 1, wherein the composition comprises 1,1'-dibenzyl-4,4'-bipyridinium dichloride.

7. An electrode comprising the composition of claim 1.

8. The electrode of claim 7, wherein the electrode is transparent, flexible, or combination thereof.

9. A solar cell comprising the electrode according to claim 7.

10. A display device comprising the electrode according to claim 7.

11. The display device of claim 10, wherein the display device is selected from the group consisting of an organic light emitting display device, an electronic paper display, a liquid crystal device, and a plasma display panel.

* * * * *